US010700109B2

(12) United States Patent
Kobayashi

(10) Patent No.: US 10,700,109 B2
(45) Date of Patent: Jun. 30, 2020

(54) SOLID-STATE IMAGING DEVICE

(71) Applicant: OLYMPUS CORPORATION, Hachioji-shi, Tokyo (JP)

(72) Inventor: Kenji Kobayashi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/227,305

(22) Filed: Dec. 20, 2018

(65) Prior Publication Data

US 2019/0123078 A1  Apr. 25, 2019

Related U.S. Application Data

(63) Continuation of application No. PCT/JP2016/069125, filed on Jun. 28, 2016.

(51) Int. Cl.
*H04N 5/374* (2011.01)
*H01L 27/146* (2006.01)
*H04N 5/3745* (2011.01)

(52) U.S. Cl.
CPC .. *H01L 27/14605* (2013.01); *H01L 27/14612* (2013.01); *H01L 27/14641* (2013.01); *H04N 5/374* (2013.01); *H04N 5/37457* (2013.01)

(58) Field of Classification Search
CPC ......... H01L 27/14605; H01L 27/14641; H01L 27/14612; H04N 5/37457; H04N 5/374
See application file for complete search history.

(56) References Cited

U.S. PATENT DOCUMENTS

2007/0046796 A1* 3/2007 McKee ............. H01L 27/14603
348/294
2008/0067325 A1* 3/2008 Tani ....................... H04N 5/374
250/208.1
(Continued)

FOREIGN PATENT DOCUMENTS

JP       5-307165 A   11/1993
JP    2010-165854 A    7/2010
(Continued)

OTHER PUBLICATIONS

International Search Report dated Aug. 16, 2016, issued in counterpart International Application No. PCT/JP2016/069125, w/English translation (4 pages).
(Continued)

*Primary Examiner* — Mekonnen D Dagnew
(74) *Attorney, Agent, or Firm* — Westerman, Hattori, Daniels & Adrian, LLP

(57) ABSTRACT

A solid-state imaging device has a pixel sharing unit, and the pixel sharing unit includes a plurality of pixel units each including a plurality of photodiodes, floating diffusions, and a plurality of read transistors, a reset transistor and an amplification transistor shared by the plurality of pixel units, a plurality of read wirings, a connection wiring that connects the floating diffusions to each other. In the pixel sharing unit, the connection wiring and each of the plurality of read wirings are disposed to have overlapping areas in a plan view, and the connection wiring and the plurality of read wirings are disposed such that parasitic capacitors generated in the plurality of overlapping areas are approximately equal to one another.

5 Claims, 10 Drawing Sheets

(56) References Cited

U.S. PATENT DOCUMENTS

| | | | |
|---|---|---|---|
| 2010/0177226 A1* | 7/2010 | Itonaga | H01L 27/14603 348/300 |
| 2010/0328198 A1 | 12/2010 | Tsubata | |
| 2013/0314574 A1* | 11/2013 | Ishii | H01L 27/1461 348/302 |

FOREIGN PATENT DOCUMENTS

| | | |
|---|---|---|
| JP | 2014-033047 A | 2/2014 |
| JP | 5700106 B2 | 4/2015 |
| WO | 2009/107271 A1 | 9/2009 |

OTHER PUBLICATIONS

Office Action dated Jan. 14, 2020, issued in counterpart JP application No. 2018-524619, with English translation. (6 pages).

* cited by examiner

SOLID-STATE IMAGING DEVICE
>
> ## CROSS REFERENCE TO RELATED APPLICATIONS
>
> This application is a continuation application based on a PCT Patent Application No. PCT/JP2016/069125, filed on Jun. 28, 2016, the entire content of which is hereby incorporated by reference.
>
> ## BACKGROUND OF THE INVENTION
>
> ### Field of the Invention
>
> The present invention relates to a solid-state imaging device, and more particularly to a layout of pixels in a MOS type solid-state imaging device.
>
> ### Description of the Related Art
>
> In recent years, video cameras and electronic still cameras have been widely used. These cameras use a solid-state imaging device (an MOS type solid-state imaging device) using an MOS type image sensor, such as a complementary metal oxide semiconductor (CMOS), and a solid-state imaging device (a charge coupled device (CCD) type solid-state imaging device) using a CCD image sensor. Since the MOS type solid-state imaging device has a low power supply voltage and is advantageous in terms of power consumption, the MOS type solid-state imaging device is widely installed in mobile devices such as a cellular phone with a camera and a personal digital assistant (PDA).
>
> In the MOS type solid-state imaging device, a plurality of pixels, which include a photodiode (PD) serving as a photoelectric conversion unit and a pixel transistor, are disposed in a two-dimensional array to constitute a pixel array unit. Recently, with the miniaturization of pixels, there has been proposed a so-called multi-pixel sharing structure in which a part of a pixel transistor is shared by a plurality of pixels in order to reduce an area occupied by the pixel transistor per one pixel (for example, Japanese Patent Registration No. 5700106).
>
> FIG. 12 is a diagram illustrating a layout of a pixel sharing unit in a pixel array unit of a solid-state imaging device according to the related art (Japanese Patent Registration No. 5700106). The pixel array unit is configured by arranging a plurality of pixel sharing units 21 in a two-dimensional array. One pixel sharing unit 21 is composed of photodiodes PD1 to PD8 of 8 (4 longitudinal×2 transverse) pixels.
>
> The pixel sharing unit 21 has a first pixel unit 23, a second pixel unit 25, read transistors Tr11 to Tr18, a reset transistor Tr2, an amplification transistor Tr3, read wirings 261 to 268, a reset wiring 27, a connection wiring 28, a power wiring 29, a vertical signal line 35, and a power wiring 36. The amplification transistor Tr3 has a source region 31S, a drain region 31D, and an amplification gate electrode 32. The reset transistor Tr2 has a source region 33S, a drain region 33D, and a reset gate electrode (not illustrated).
>
> The first pixel unit 23 has the photodiodes PD1 to PD4, read gate electrodes 221 to 224, and a floating diffusion FD1. The read transistors Tr11 to Tr14 are composed of the photodiodes PD1 to PD4, the floating diffusion FD1, and the read gate electrodes 221 to 224, respectively.
>
> In the first pixel unit 23, the four photodiodes PD1 to PD4 having an approximately quadrangular shape have a 2 longitudinal×2 transverse arrangement at desired intervals, for example, equal intervals in longitudinal and transverse directions. The floating diffusion FD1 is disposed in a center area surrounded by the four photodiodes PD1 to PD4. The read gate electrodes 221 to 224 are disposed at corner sides, at which the four photodiodes PD1 to PD4 face one another, so as to come in contact with the floating diffusion FD1.
>
> Each of the read gate electrodes 221 to 224 has an approximately triangular shape or an approximately trapezoidal shape. The read gate electrode 221 is disposed such that a bottom side is positioned at the photodiode PD1 side and a top side is positioned at the floating diffusion FD1 side. The same applies to the read gate electrodes 222 to 224. The four read gate electrodes 222 to 224 have the same shape and are symmetrically disposed about the floating diffusion FD1.
>
> The second pixel unit 25 has photodiodes PD5 to PD8, read gate electrodes 225 to 228, and a floating diffusion FD2. The read transistors Tr15 to Tr18 are composed of the photodiodes PD5 to PD8, the floating diffusion FD2, and the read gate electrodes 225 to 228, respectively.
>
> In the second pixel unit 25, the form photodiodes PD5 to PD8 having an approximately quadrangular shape are have a 2 longitudinal×2 transverse arrangement at desired intervals, for example, equal intervals in longitudinal and transverse directions. The floating diffusion FD2 is disposed in a center area surrounded by the four photodiodes PD5 to PD8. The read gate electrodes 225 to 228 are disposed at corner sides, the four photodiodes PD5 to PD8 face one another, so as to come in contact with the floating diffusion FD2.
>
> Each of the read gate electrodes 225 to 228 has an approximately triangular shape or an approximately trapezoidal shape. The read gate electrode 225 is disposed such that a bottom side is positioned at the photodiode PD5 side and a top side is positioned at the floating diffusion FD2 side. The same applies to the read gate electrodes 226 to 228. The four read gate electrodes 225 to 228 have the same shape and are symmetrically disposed about the floating diffusion FD2.
>
> The read wirings 261 to 268 are formed such that they are respectively connected to the read gate electrodes 221 to 228 of the read transistors Tr11 to Tr18, receive an independent read pulse, and are independently controlled. In the four read wirings 261 to 264 disposed in a transverse direct on in parallel to one another and the four read wirings 265 to 268 disposed in the transverse direction in parallel to one another, gaps between the wirings are set to intervals equal to or less than a diffraction limit. The reset wiring 27 is configured such that it is connected to a reset gate electrode (not illustrated) of the reset transistor Tr2 and a reset pulse is applied.
>
> The connection wiring 28 is connected to the floating diffusion FD1, the floating diffusion FD2, the sauce region 33S of the reset transistor Tr2, and the amplification gate electrode 32 of the amplification transistor Tr3. The power wiring 29 is connected to the drain region 33D of the reset transistor Tr2. The vertical signal line 35 is connected to the source region 31S of the amplification transistor Tr3. The power wiring 36 is connected to the drain region 31D of the amplification transistor Tr3.
>
> The reset transistor Tr2 is disposed in an area between the photodiodes PD1 and PD2 at a center part above the first pixel unit 23. Regarding the reset transistor Tr2, the drain region 33D and the source region 33S are respectively disposed on sides above and below thereof with the reset gate electrode (not illustrated) interposed therebetween.
>
> The amplification transistor Tr3 is disposed between the first pixel unit 23 and the second pixel unit 25. The amplification transistor Tr3 is composed of the amplification gate electrode 32 having a gate length long in the transverse direction, and the source region 31S and the drain region 31D positioned at both ends of the amplification gate electrode 32. The length of the amplification gate electrode 32 in a gate length direction is formed to be longer than a width of one pixel pitch. For example, the length of the amplification gate electrode 32 is formed to approximately coincide with transverse lengths of the two photodiodes PD1 and PD2, that is, to be a dimension near two pixel pitches.

In a pixel layout structure of the solid-state imaging device, a parasitic capacitor exists between a connection wiring and other wirings. The parasitic capacitor causes noise due to a variation of transfer characteristics of a wiring when a signal is read from a photodiode to a floating diffusion, so that image quality is degraded. Particularly, a parasitic capacitor, which exists in an overlapping area between the connection wiring and a read wiring for controlling reading from each photodiode to the floating diffusion, has a large influence on a variation of transfer characteristics, which occurs when a signal is read.

As illustrated in FIG. 12, in the layout of the pixel sharing unit in Japanese Patent Registration No. 5700106, there are overlapping areas between the connection wiring 28 and each of the read wirings 261 to 266, but there are no overlapping areas between the connection wiring 28 and the read wirings 267 and 268 in a plan view.

When charge of the photodiodes PD1 to PD6 is transferred to the floating diffusion FD1 or FD2, a control pulse is applied to any one of the read wirings 261 to 266. The control pulse has an influence on an output level of the charge via parasitic capacitors existing in the overlapping areas between the connection wiring 28 and the read wirings 261 to 266.

On the other hand, when charge of the photodiodes PD7 and PD8 is transferred to the floating diffusion FD2, a control pulse is applied to any one of the read wirings 267 and 268. However, the control pulse has no influence on an output level of the charge because there are no overlapping areas between the connection wiring 28 and the read wirings 267 and 268.

As described above, the output level differs in the photodiodes PD1 to PD6 and the photodiodes PD7 and PD8. That is, a step difference occurs in output from the photodiodes PD1 to PD6 and the photodiodes PD7 and PD8, so that a horizontal streak-like fixed pattern noise (FPN) occurs and thus image quality is degraded.

SUMMARY

According to a first aspect of the present invention, a solid-state imaging device has a pixel sharing unit, wherein the pixel sharing unit includes: a plurality of pixel units each including a plurality of photodiodes that store charge corresponding to an amount of incident light, floating diffusions shared by the plurality of photodiodes, and a plurality of read transistors provided corresponding to the plurality of photodiodes and reading the charge stored in each photodiode to the floating diffusion; a reset transistor and an amplification transistor shared by the plurality of pixel units; a plurality of read wirings respectively connected to read gate electrodes of the plurality of read transistors; and a connection wiring that connects the plurality of floating diffusions included in each of the plurality of pixel units to each other, wherein, in the pixel sharing unit, the connection wiring and each of the plurality of read wirings are disposed to have overlapping areas in a plan view, and the connection wiring and the plurality of read wirings are disposed such that parasitic capacitors generated in the plurality of overlapping areas are approximately equal to one another.

According to a second aspect of the present invention, in the solid-state imaging device of the first aspect, the connection wiring and the plurality of read wirings may be disposed such that areas of the plurality of overlapping areas are approximately equal to one another.

According to a third aspect of the present invention, in the solid-state imaging device of the first aspect or the second aspect, the plurality of floating diffusions included in the pixel sharing unit and the reset transistor may be disposed on a straight line and are connected to each other by the connection wiring, and the plurality of overlapping areas may all be disposed between the reset transistor and a floating diffusion disposed at a position remotest from the reset transistor.

According to a fourth aspect of the present invention, in the solid-state imaging device of any one of the first aspect to the third aspect, a reset wiring connected to a reset gate electrode of the reset transistor and the connection wiring may be disposed such that there is no overlapping area in the plan view.

According to a fifth aspect of the present invention, in the solid-state imaging device of any one of the first aspect to the fourth aspect, the pixel sharing may include two pixel units each including the plurality of photodiodes disposed in 2 rows×2 columns and one floating diffusion disposed at a center of the plurality of photodiodes disposed in 2 rows=2 columns, and the pixel units may be juxtaposed in a column direction.

DETAILED DESCRIPTION OF THE PREFERRED EMBODIMENTS

Hereinafter, embodiments of the present invention will be described with reference to the drawings.

Firstly, a configuration of a digital camera including a solid-state imaging device according to an embodiment of the present invention will be described.

Figure 1:
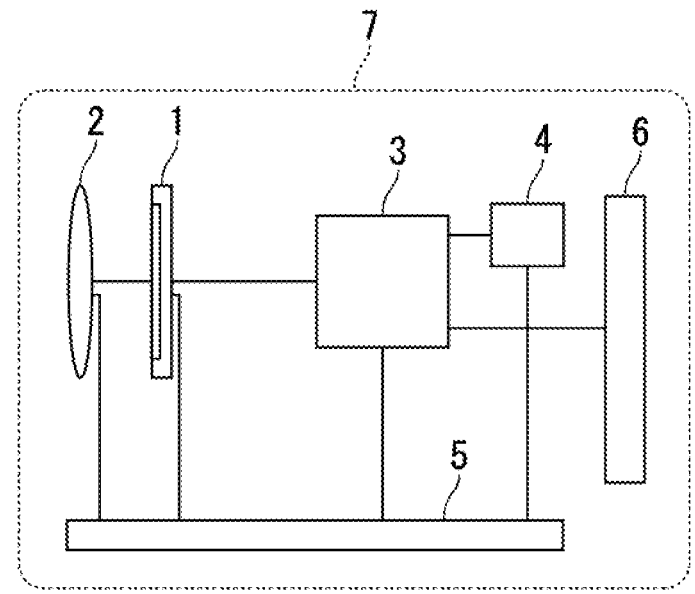
FIG. 1 is a block diagram illustrating a schematic configuration of a digital camera including a solid-state imaging device according to an embodiment of the present invention.

FIG. 1 is a block diagram illustrating a schematic configuration of a digital camera 7 including a solid-state imaging device 1 according to an embodiment of the present invention.

The digital camera 7 includes the solid-state imaging device 1, a lens unit 2, an image signal processing device 3, a recording device 4, a camera control device 5, and a display device 6. In the lens unit 2, driving of rooming, focusing, a diaphragm and the like is controlled by the camera control device 5 and an image of a subject is formed on the solid-state imaging device 1. The solid-state imaging device 1 is an MOS type solid-state imaging device, is driven and controlled by the camera control device 5, and converts subject light incident into the solid-state imaging device 1 via the lens unit 2 into an image signal.

The image signal processing device 3 is controlled by the camera control device 5 and performs processes, such as signal amplification, conversion to image data, various types of correction, and image data compression, on the image signal output from the solid-state imaging device 1. The recording device 4 is a detachable recording medium such as a semiconductor memory, is driven and controlled by the camera control device 5, and records or reads image data.

The camera control device 5 is a control device that controls the entire digital camera 7, and controls the solid-state imaging device 1, the lens units 2, the image signal processing device 3, and the recording device 4. The display device 6 is a display device such as a liquid crystal that displays an image, which is formed on the solid-state imaging device 1, based on image data processed by the image signal processing device 3 or image data read from the recording device 4.

Figure 2:
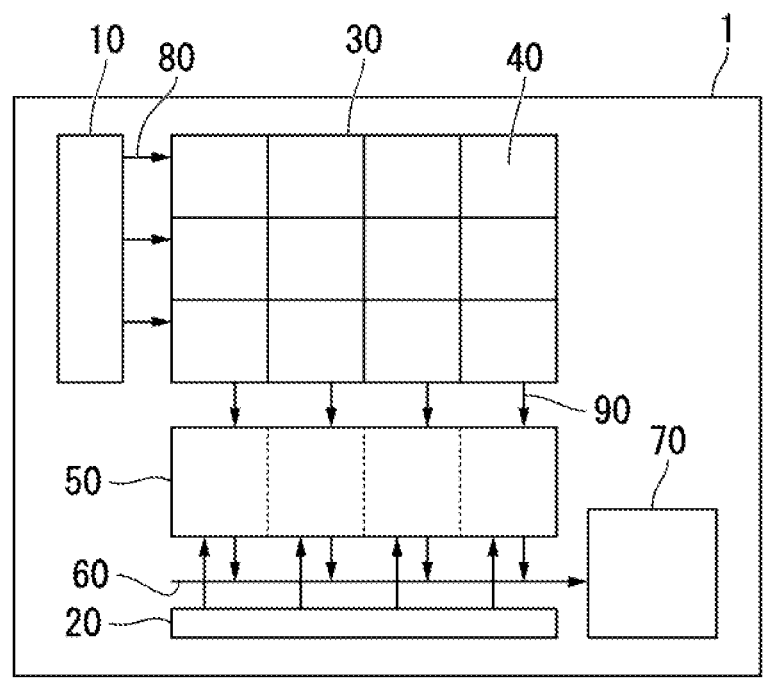
FIG. 2 is a block diagram illustrating a schematic configuration of the solid-state imaging device according to the embodiment of the present invention.

Next, a configuration of the solid-state imaging device according to an embodiment of the present invention will be described. FIG. 2 is a block diagram illustrating a schematic configuration of the solid-state imaging device 1 according to the embodiment of the present invention. The solid-state imaging device 1 includes a vertical reading circuit 10, a horizontal reading circuit 20, a pixel array unit 30, column signal processing circuits 50, and an output amplifier 70.

In the pixel array unit 30, a plurality of pixel sharing units 40 are disposed in a matrix form. In the example of FIG. 2, the pixel array unit 30 includes 12 (3 longitudinal×4 transverse) pixel sharing units 40. Each of the pixel sharing units 40 includes a plurality of pixels. Each pixel has a photodiode and a plurality of pixel transistors (so-called MOS transistors). The plurality of pixel transistors, for example, can be configured with three transistors of a transfer transistor, a reset transistor, and an amplification transistor. In addition, the plurality of pixel transistors can also be configured with four transistors inclusive of a selection transistor.

The plurality of pixel sharing units 40 disposed in the same row are connected to the vertical reading circuit 10 through one control signal line 80. In the example of FIG. 2, four pixel sharing units 40 disposed in the same row are connected to the vertical reading circuit 10 through one control signal line 80. Furthermore, the plurality of pixel sharing units 40 disposed in the same column are connected to the column signal processing circuit 50 through one vertical signal line 90. In the example of FIG. 2, three pixel sharing units 40 disposed in the same column are connected to the column signal processing circuit 50 through one vertical signal line 90.

The vertical reading circuit 10 controls each of the pixel sharing units 40 via the control signal line 80 such that a pixel signal of the pixel sharing units 40 is output to the vertical signal line 90. That is, the vertical reading circuit 10 outputs a control signal for controlling the pixel sharing units 40 to each row of the pixel sharing units 40 via the control signal line 80. The pixel sharing unit 40 converts incident subject light into a pixel signal and outputs the pixel signal corresponding to the incident subject light to the vertical signal line 90 in accordance with the control signal input from the vertical reading circuit 10.

The column signal processing circuits 50 are provided to correspond to the plurality of pixel sharing units 40 disposed in the same column and are connected to the plurality of pixel sharing units 40 disposed in the same column through one vertical signal line 90. In the example of FIG. 2, the column signal processing circuits 50 are provided to correspond to three pixel sharing units 40 disposed in the same column and are connected to the three pixel sharing units 40 disposed in the same column through one vertical signal line 90. In the example of FIG. 2, four column signal processing circuits 50 are provided.

Each of the column signal processing circuits 50 receives pixel signals, which are output from the pixel sharing units 40 of one corresponding column, via the vertical signal line 90. Furthermore, each of the column signal processing circuits 50 is connected to a horizontal signal line 60. The column signal processing circuit 50 performs signal processing, such as a noise suppression process and a correlated double sampling (CDS) process, on the pixel signals received from the pixel sharing units 40 of one corresponding column via the vertical signal line 90, and outputs an output signal to the horizontal signal line 60 under the control of the horizontal reading circuit 20. In FIG. 2, arrows from the horizontal reading circuit 20 to the column signal processing circuits 50 indicate that the horizontal reading circuit 20 controls the column signal processing circuits 50.

The horizontal reading circuit 20 controls each column signal processing circuit 50 disposed in each column to output the output signal, which is obtained by performing the signal processing on the pixel signal, to the horizontal signal line 60. The output amplifier 70 amplifies the output signals output from the column signal processing circuits 50 via the horizontal signal line 60, and outputs the amplified signals to an exterior of the solid-state imaging device 1.

First Embodiment

Figure 3:
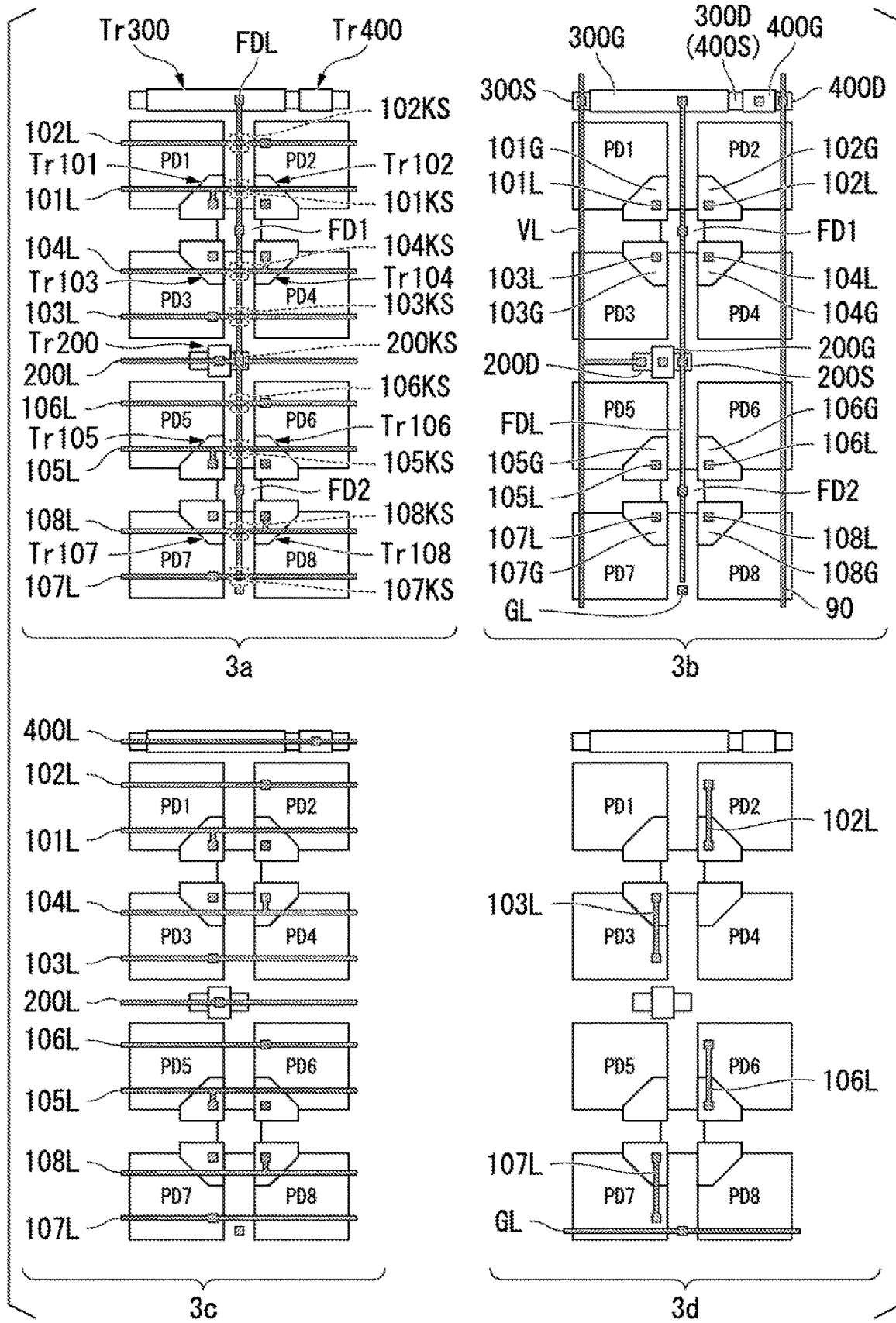
FIG. 3 is a diagram illustrating a pixel layout structure in a pixel sharing unit of a solid-state imaging device according to a first embodiment of the present invention.

A pixel layout structure in a pixel sharing unit of a solid-state imaging device according to a first embodiment of the present invention will be described. The first embodiment is an example of a pixel layout structure in which a connection wiring is partially extended. FIG. 3 is a diagram illustrating the pixel layout structure in the pixel sharing unit of the solid-state imaging device according to the first embodiment of the present invention. As described above, in the pixel array unit 30, a plurality of pixel sharing units 40 are disposed in a matrix form and each of the pixel sharing units 40 is composed of a plurality of pixels. In the first embodiment, as illustrated in FIG. 3, one pixel sharing unit 40 is composed of 8 (4 longitudinal×2 transverse) photodiodes PD1 to PD8.

(3a) of FIG. 3 is a diagram illustrating rain elements of the pixel layout structure in one pixel sharing unit 40 and is a diagram illustrating only a part of the structure for the purpose of description. In the pixel sharing unit 40, a wiring is composed of three wiring layers. (3b) to (3d) of FIG. 3 are exploded diagrams for understanding patterns of a first layer to a third layer of the wiring in the pixel sharing unit 40. (3b) is a diagram when the first layer (the highest layer) of the wiring is viewed from above, (3c) is a diagram hen the second layer of the wiring is viewed from above, and (3d) is a diagram when the third layer (the lowest layer) of the wiring is viewed from above.

The pixel sharing unit 40 has a first pixel unit, a second pixel unit, a reset transistor Tr200, an amplification transistor Tr300, and a selection transistor Tr400. In the pixel sharing unit 40, the first pixel unit and the second pixel unit are juxtaposed in a column direction.

The first pixel unit has 2 longitudinal×2 transverse (2 rows×2 columns), that is, four photodiodes PD1 to PD4, read gate electrodes 101G to 104G, a floating diffusion FD1, and read transistors Tr101 to Tr04. The second pixel unit has 2 longitudinal×2 transverse (2 rows×2 columns), that is, four photodiodes PD5 to PD8, read gate electrodes 105G to 108G, a floating diffusion FD2, and read transistors Tr105 to Tr108.

The photodiodes PD1 to PD8 store signal charge generated by photoelectrically converting incident light. Each of the photodiodes PD1 to PD8 has an approximately quadrangular shape and are disposed in 4 longitudinal×2 transverse at desired intervals, for example, equal internals in longitudinal and transverse directions.

The read transistors Tr101 to Tr108 are provided corresponding to the photodiodes PD1 to PD5, respectively. The read transistors Tr101 to Tr108 apply pulses via read wirings 101L to 108L on the basis of read control signals φTX1 to φTX8 from the vertical reading circuit 10, thereby transferring the signal charge stored in the photodiodes PD1 to PD5 to the floating diffusions FD1 and FD2.

The reset transistor Tr200 has a source electrode 200S, a drain electrode 200D, and a gate electrode 200G. The reset transistor Tr200 is disposed in an area between the photodiodes PD3 and PD4 and the photodiodes PD5 and PD6 at the center of the pixel sharing unit 40.

The reset transistor Tr200 applies a pulse via a reset wiring 200L on the basis of a reset control signal φRST from the vertical reading circuit 10, thereby resetting the signal charge stored in the photodiodes PD1 to PD5 and the signal charge stored in the floating diffusions FD1 and FD2 with a power supply voltage VDD via a power wiring VL.

The amplification transistor Tr300 has a source electrode 300S, a drain electrode 300D, and a gate electrode 300G. The amplification transistor Tr300 is disposed in an area between the power wiring VL and the vertical signal line 90 above the photodiodes PD1 and PD2 at an upper part of the pixel sharing unit 40. The amplification transistor Tr300 outputs an amplification signal corresponding to the sural charge stored in the floating diffusions FD1 and FD2 from the source electrode 300S.

The selection transistor Tr400 has a source electrode 400S, a drain electrode 400D, and a gate electrode 400G.

The selection transistor Tr400 is disposed in an area between the amplification transistor Tr300 and the vertical signal line 90 above the photodiodes PD1 and PD2 at the upper part of the pixel sharing unit 40. The source electrode 400S of the selection transistor Tr400 is connected to the drain electrode 300D of the amplification transistor Tr300. The selection transistor Tr400 applies a pulse via a selection wiring 400L on the basis of a selection control signal φSEL from the vertical reading circuit 10, thereby reading a pixel signal, which is output from the source electrode 300S of the amplification transistor Tr300, to the vertical signal line 90.

The floating diffusion FD1 is disposed in a center area surrounded by the four photodiodes PD1 to PD4. The floating diffusion FD1 converts signal charge transferred from the photodiodes PD1 to PD4 into a voltage, and outputs the voltage to the gate electrode 300G of the amplification transistor Tr300 via a connection wiring FDL.

The floating diffusion FD2 is disposed in a center area surrounded by the four photodiodes PD5 to PD8. The floating diffusion FD2 converts signal charge transferred from the photodiodes PD5 to PD8 into a voltage, and outputs the voltage to the gate electrode 300G of the amplification transistor Tr300 via the connection wiring FDL.

The connection wiring FDL is wired at the center of the pixel sharing unit 40 in a longitudinal direction in the first layer of the wiring. The connection wiring FDL electrically connects the floating diffusions FD1 and FD2, the gate electrode 300G of the amplification transistor, and the source electrode 200S of the reset transistor to one another. In the present embodiment, as illustrated in FIG. 3, the connection wiring FDL extends to parts below the photodiodes PD7 and PD8, and is disposed to form overlapping areas 101KS to 108KS with the read wirings 101L to 108L. Furthermore, the connection wiring FDL forms an overlapping area 200KS with the reset wiring 200L.

A substrate potential supply wiring GL is wired at the lower part of the pixel sharing unit 40 in a transverse direction in the third layer of the wiring. The substrate potential supply wiring GL supplies a substrate potential (a ground potential) GND each transistor of the pixel.

Each of the read wirings 101L to 108L is wired in the transverse direction of the pixel sharing unit 40 in the second layer of the wiring. The read wirings 101L to 108L are formed such that they are respectively connected to the read gate electrodes 101G to 108G of the read transistors Tr101 to Tr108, receive an independent read pulse, and are independently controlled.

The reset wiring 200L is configured to be connected to the gate electrode 200G of the reset transistor Tr200 and to receive a reset pulse. The selection wiring 400L is disposed to overlap the selection transistor Tr400 and is connected to the gate electrode 400G of the selection transistor Tr400. The read wirings 101L to 108L, the reset wiring 200L, and the selection wiring 400L are wired in the transverse direction of the pixel sharing unit 40 the second layer of the wiring, and are disposed such that intervals among them are as large as possible or are approximately equal to one another.

The power wiring VL is wired at the left side of the pixel sharing unit 40 in the longitudinal direction in the first layer of the wiring, and is corrected to the drain region 200D of the reset transistor Tr200 and the source region 300S of the amplification transistor Tr300. The vertical signal line 90 is wired at the right side of the pixel sharing unit 40 in the longitudinal direction in the first layer of the wiring, and is connected to the drain electrode 400D of the selection transistor Tr400.

Figure 4:
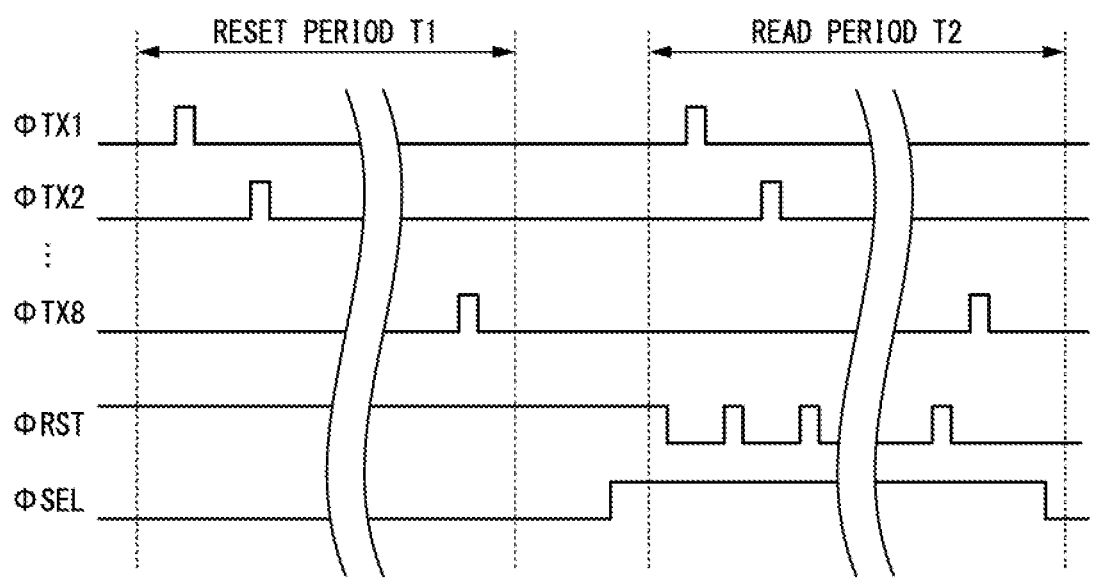
FIG. 4 is a timing chart illustrating an operation of a pixel in the pixel sharing unit of the solid-state imaging device according to the first embodiment of the present invention.

Next, a description will be provided for an operation of a pixel in the case of using the pixel layer structure in the pixel sharing unit of the solid-state imaging device according to the first embodiment of the present invention. FIG. 4 is a timing chart illustrating an operation of a pixel in the pixel sharing unit of the solid-state imaging device according to the first embodiment of the present invention. In FIG. 4, a vertical axis denotes a pulse of each signal (ON/OFF states) and a horizontal axis denotes time. Signals illustrated in FIG. 4 include the read control signals ϕTX1 to ϕTX8 output from the vertical reading circuit 10, the reset control signal ϕRST output from the vertical reading circuit 10, and the selection control signal ϕSEL output from the vertical reading circuit 10 sequentially from the top.

Consequently, ϕTX1 to ϕTX8 indicate control pulses supplied to the read wirings 101L to 108L, ϕRST indicates a control pulse supplied to the reset wiring 200L, and ϕSEL indicates a control pulse supplied to the selection wiring 400L.

A reset period T1 is a period in which the signal charge stored in the photodiodes PD1 to PD8 is reset. In the reset period T1, the reset control signal ϕRST is in an ON state, so that the reset transistor Tr200 enters an ON state. By the read control signals ϕTX1 to ϕTX8, a pulse is sequentially applied to the transfer transistors Tr101 to Tr108. In this way the signal charge stored in the photodiodes PD1 to PD8 is reset via the reset transistor Tr200 and the transfer transistors Tr101 to Tr108 and signal storage is started. The width of the pulse, for example, is 1 microsecond (μs) and the reset period T1, for example, is 16 microseconds (μs).

A read period T2 is a period in which a read operation of the pixel sharing unit 40 is started after the reset period T1 has ended and a prescribed period has passed (after an arbitrary exposure time has passed). After the prescribed period passes (after the arbitrary exposure time passes) after the reset operation, the selection control signal ϕSEL is in an ON state, so that the output of the pixel sharing unit 40 is electrically connected to the vertical signal line 90 via the selection transistor Tr400 and is selected as input to the column signal processing circuits 50. The width of the pulse, for example, is 1 microsecond (μs) and the read period T2, for example, is 16 microseconds (μs).

Next, a pulse is applied on the basis of the reset control signal ϕRST, so that the reset transistor Tr200 enters an ON state and the floating diffusions FD1 and FD2 are reset. The reset transistor Tr200 enters an OFF state, and then the reset signal is read to the vertical signal line 90.

Next, a pulse is applied via the control signal ϕTX1, so that the read transistor Tr101 enters an ON state and the signal charge stored in the photodiode PD1 is transferred to the floating diffusions FD1 and FD2. The read transistor Tr101 enters an OFF state, and then a pixel signal is read to the vertical signal line 90. Thereafter, a noise suppression process and the like are performed on the pixel signal based on a reset signal read in the column signal processing circuits 50. The aforementioned operation is similarly performed for the photodiodes PD2 to PD8, and the read operation of the pixel sharing unit 40 is completed upon the completion of the operation to the photodiodes PD1 to PD8.

Figure 5:
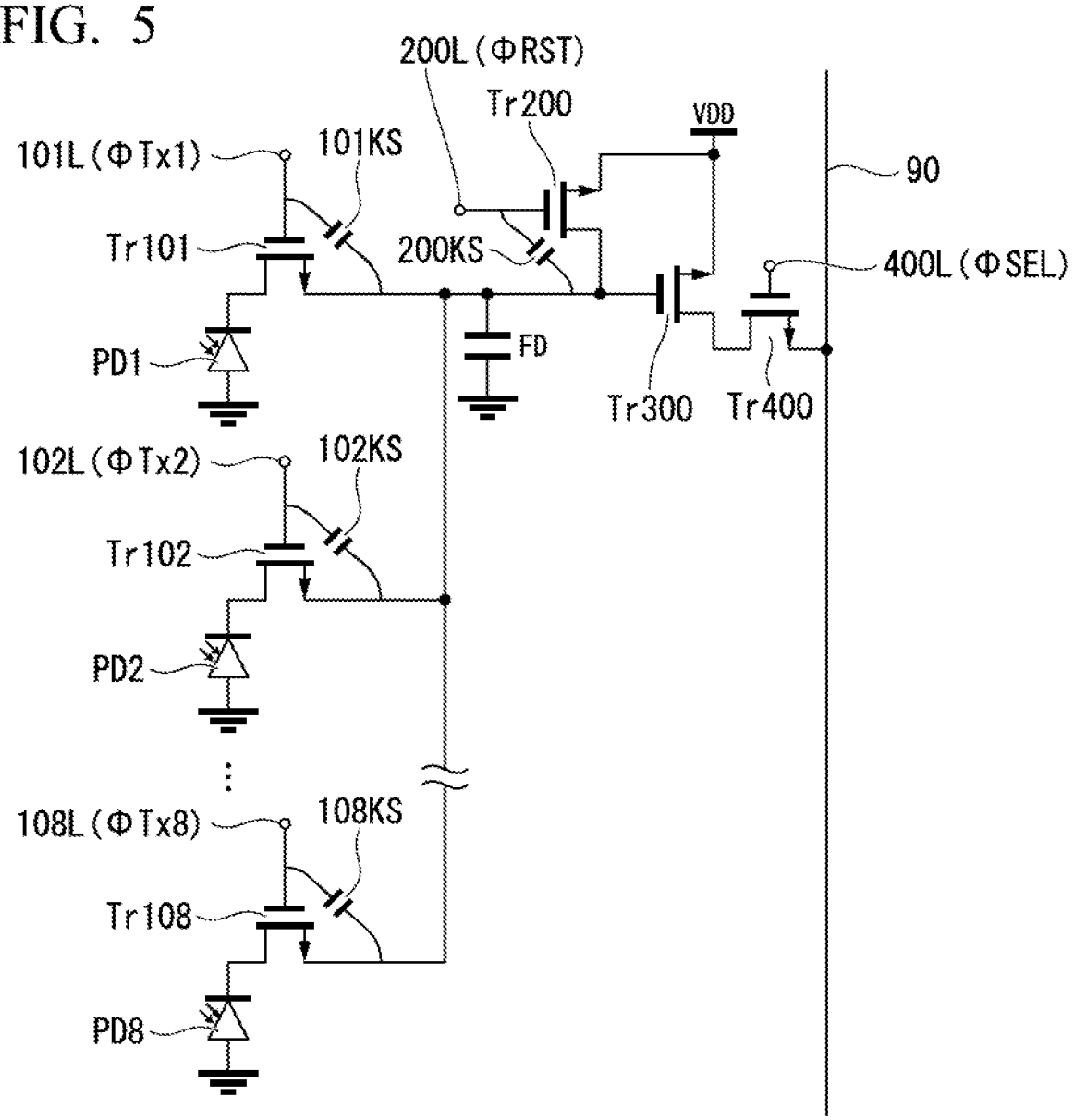
FIG. 5 is a circuit diagram of the pixel sharing unit of the solid-state imaging device according to the first embodiment of the present invention.

FIG. 5 is a circuit diagram of the pixel sharing unit of the solid-state imaging device according to the first embodiment of the present invention. FIG. 5 is a circuit diagram conceptually illustrating each element of the pixel sharing unit in the layout diagram of FIG. 3, and the same reference numerals are used to designate the same elements as those of FIG. 3.

The overlapping areas 101KS to 108KS in FIG. 3 are expressed as capacitors in FIG. 5. Specifically a parasitic capacitor caused by the overlapping area 101KS between the read wiring 101L and the connection wiring FDL in FIG. 3 is expressed as a capacitor 101KS in FIG. 5. The same is applied to the overlapping areas 102KS to 108KS.

In FIG. 5, a capacitor FD indicates a capacitor excluding parasitic capacitors caused by the overlapping areas 101KS to 108KS from capacitors including the floating diffusions FD1 and FD2 and the gate electrode 300G of the amplification transistor Tr300.

Figure 6:
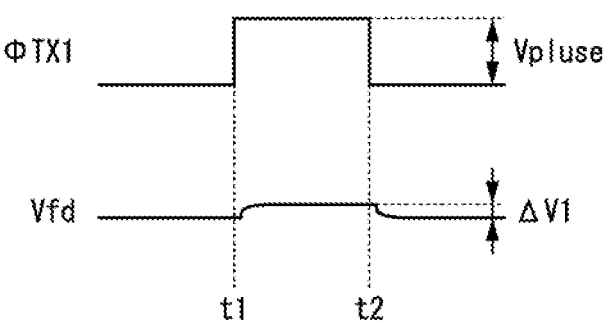
FIG. 6 is a timing chart illustrating a change in a potential of an FD node when signal charge to be transferred is small in the pixel sharing unit of the solid-state imaging device according to the first embodiment of the present invention.

FIG. 6 is a timing chart illustrating a change in a potential of an FD node when signal charge to be transferred is small in the pixel sharing unit of the solid-state imaging device according to the first embodiment of the present invention. In FIG. 6, a vertical axis denotes the size of a potential and a horizontal axis denotes time. FIG. 6 illustrates the movement of a potential of the read control signal ϕTX1 and the movement of a potential Vfd of the FD node when the read gate electrode 101G has been turned ON/OFF.

At a time t1, the read gate electrode 101G enters an ON state, so that the potential of the read control signal ϕTX1 is increased and thus the potential Vfd of the FD node is increased. At a time t2, the read gate electrodes 101G enters an OFF state, so that the potential of the read control signal ϕTX1 is decreased to return to the original size and thus the potential Vfd of the FD node is decreased to return to the original size.

Specifically, at the time t1, when the read gate electrode 101G enters an ON state, the potential of the read control signal ϕTX1 is increased by Vpluse [V]. Accordingly, the potential Vfd of the FD node is increased by ΔV1 [V] due to an influence of feedthrough by the parasitic capacitor 101KS. When the capacitance value of the parasitic capacitor 101KS is set as C101KS [F] and the capacitance value of the floating diffusion is set as CFD [F], ΔV1 is expressed by the fallowing Equation (1).

$$\Delta V1 = C101KS \times Vpluse/(C101KS + CFD) \qquad (1)$$

With an increase in the potential Vfd of the FD node, the signal charge stored in the photodiode PD1 is easily transferred.

In the present embodiment, the connection wiring FDL extends to parts below the photodiodes PD7 and PD5, so that the areas of the overlapping areas 101KS to 108KS are approximately equal to one another. In this way, the values of the parasitic capacitors caused by the overlapping areas 101KS to 108KS can be approximately equal to one another. Accordingly, in each of the photodiodes PD1 to PD5, an increase in the potential Vfd of the FD node due to an influence of feedthrough at the time of charge transfer can be approximately equal to ΔV1. In each of the photodiodes PD1 to PD8, an increase in the potential Vfd of the FD node due to an influence of the feedthrough in the charge transfer is approximately equal to ΔV1, so that transfer at the time of charge transfer of each of the photodiodes PD1 to PD8 becomes easy, that is, transfer characteristics become uniform.

That is, in the present embodiment, the areas of the overlapping areas 101KS to 108K between the read wirings 101L to 108L and the connection wiring FDL become approximately equal to one another. In this way it is possible to suppress a variation of transfer characteristics at the time of charge transfer of all pixels corresponding to the photodiodes PD1 to PD8, so that noise due to a parasitic capacitor is reduced and thus high image quality is achieved.

Modification Example 1

Figure 7:
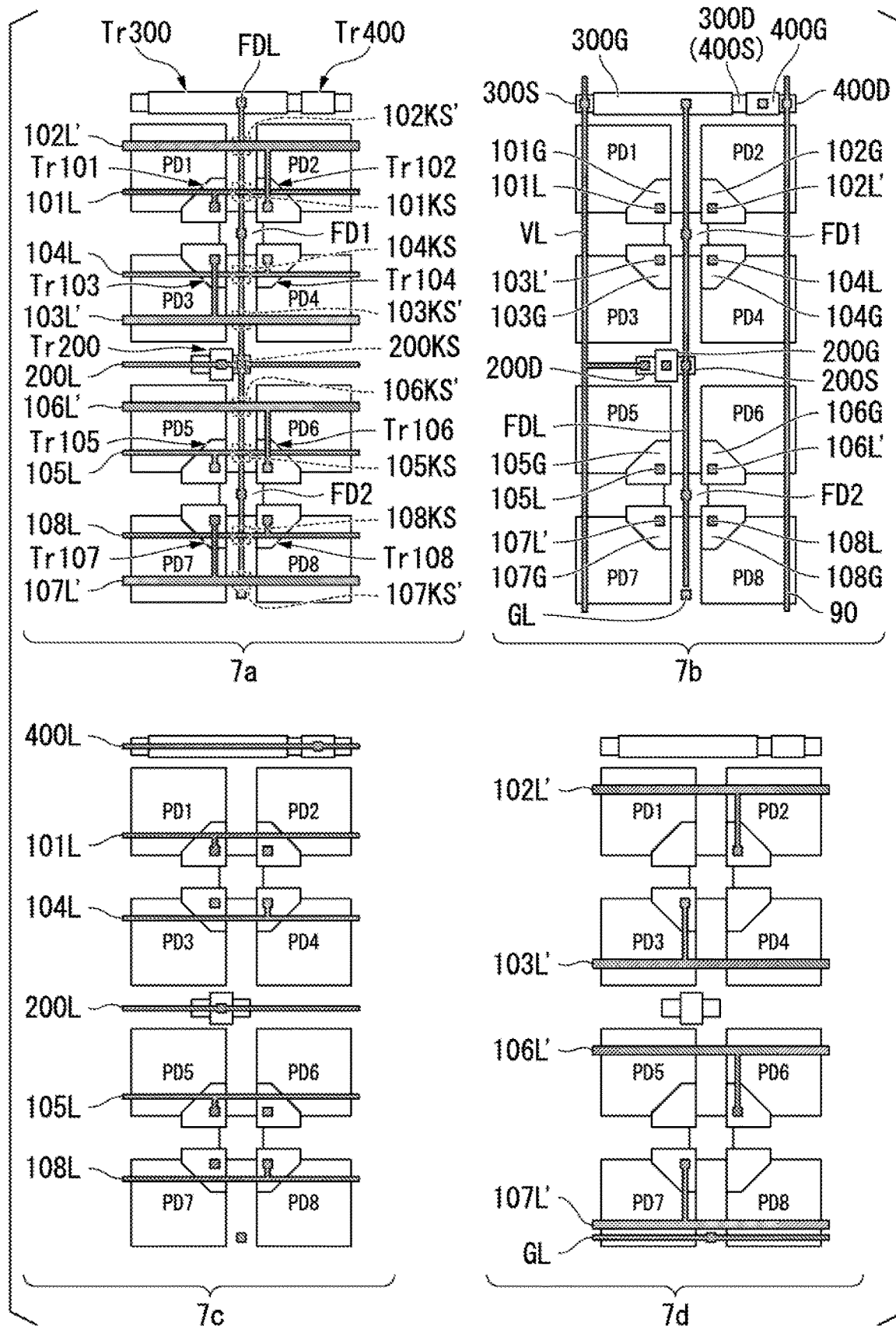
FIG. 7 is a diagram illustrating a pixel layout structure in a pixel sharing unit of a solid-state imaging device according to a modification example 1 of the first embodiment of the present invention.

The following description will be provided for a pixel layout structure in a pixel sharing unit of a solid-state imaging device according to a modification example 1 of the first embodiment of the present invention. The modification example 1 is an example in which parasitic capacitors are approximately equal to one another even though the sizes of overlapping areas between each read wiring and a connection wiring are different from one another. FIG. 7 is a diagram illustrating the pixel layout structure in the pixel sharing unit of the solid-state imaging device according to the modification example 1 of the first embodiment of the present invention.

(7a) of FIG. 7 is a diagram illustrating main elements of the pixel layout structure in one pixel sharing unit 40 and is a diagram illustrating only a part of the structure for the purpose of description. In the pixel sharing unit 40, a wiring is composed of three wiring layers. (7b) to (7d) of FIG. 7 are exploded diagrams for understanding patterns of a first layer to a third layer of the wiring in the pixel sharing unit 40. (7b) is a diagram when the first layer (the highest layer) of the wiring is viewed from above, (7c) is a diagram when the second layer of the wiring is viewed from above, and (7d) is a diagram when the third layer (the lowest layer) of the wiring is viewed from above.

The pixel layout structure of the modification example 1 of FIG. 7 is different from the pixel layout structure of the first embodiment of FIG. 3 in that the read wirings 102L, 103L, 106L, and 107L of FIG. 3 are changed to read wirings 102L', 103L', 106L', and 107L' in FIG. 7. Since the other configuration of FIG. 7 is identical to that of FIG. 3, a description thereof will be omitted.

The read wirings 101L', 103L', 106L', and 107L' of FIG. 7 are different from the read wirings 102L, 103L, 106L, and 107L of FIG. 2 in terms of wiring positions and wiring widths. Specifically, the read wirings 102L, 103L, 106L, and 107L of FIG. 3 are wired in the second layer of the wiring, but the read wirings 102L', 103L', 106L', and 107L' of FIG. 7 are wired in the third layer of the wiring.

Furthermore, wiring widths of the read wirings 102L', 103L', 106L', and 107L' of FIG. 7 are formed to be larger than those of the read wirings 102L, 103L, 106L, and 107L of FIG. 3.

When an electric constant of a substance between the read wiring 10iL (i=1, 2, . . . , 8) and the connection wiring FDL is set as ε[F·m$^{-1}$], an area of an overlapping area between the read wiring 10iL (i=1, 2, . . . , 8) and the connection wiring FDL is set as Si [m$^2$] (i=1, 2, . . . , 8), and a distance between the read wiring 10iL (i=1, 2, . . . , 8) and the connection wiring FDL is set as di [m] (i=1, 2, . . . , 8), a capacitance value C10iKF [F] of the overlapping area is expressed by the following Equation (2).

$$C10iKS = \varepsilon Si/Di \ (i=1, 2, \ldots, 8) \tag{2}$$

In Equation (2) above, when the distance di (i=1, 2, . . . , 8) between the read wiring 10iL (i=1, 2, . . . , 8) and the connection wiring FDL is large, the area Si (i=1, 2, . . . , 8) of the overlapping area between the read wiring 10iL (i=1, 2, . . . , 8) and the connection wiring FDL is made large, so that the capacitance value of the overlapping area can be constantly kept.

In the modification example 1, the connection wiring FDL is wired in the first layer of the wiring, the read wirings 101L, 104L, 105L, and 108L are wired in the second layer of the wiring, and the read wirings 102L', 103L', 106L', and 107L' are wired in the third layer of the wiring. Accordingly, distances d2, d3, d6, and d7 between the read wirings 102L', 103L', 106L', and 107L' and the connection wiring FDL are larger than distances d1, d4, d5, and d8 between the read wirings 101L, 104L, 105L, and 108L and the connection wiring FDL.

Then, the wiring widths of the read wirings 102L', 103L', 106L', and 107L' are made larger than those of the read wirings 101L, 104L, 105L, and 108L, so that the areas S2, S3, 56, and 57 of the overlapping areas between the read wirings 102L', 103L', 106L', and 107L' and the connection wiring FDL are larger than the areas S1, S4, S5 and S8 of the overlapping areas between the read wirings 101L, 104L, 105L, and 108L and the connection wiring FDL. In this way, as described above, the capacitance values of the overlapping areas can be constantly kept.

That is, as with the modification example 1, when inter-wiring distances between the read wirings and the connection wiring are made long in overlapping areas between some read wirings and the connection wiring, if the areas of the overlapping areas are made large accordingly, the values of the parasitic capacitor of the overlapping areas can be approximately equal to one another, thereby obtaining effects similar to those of the first embodiment.

Modification Example 2

Figure 8:
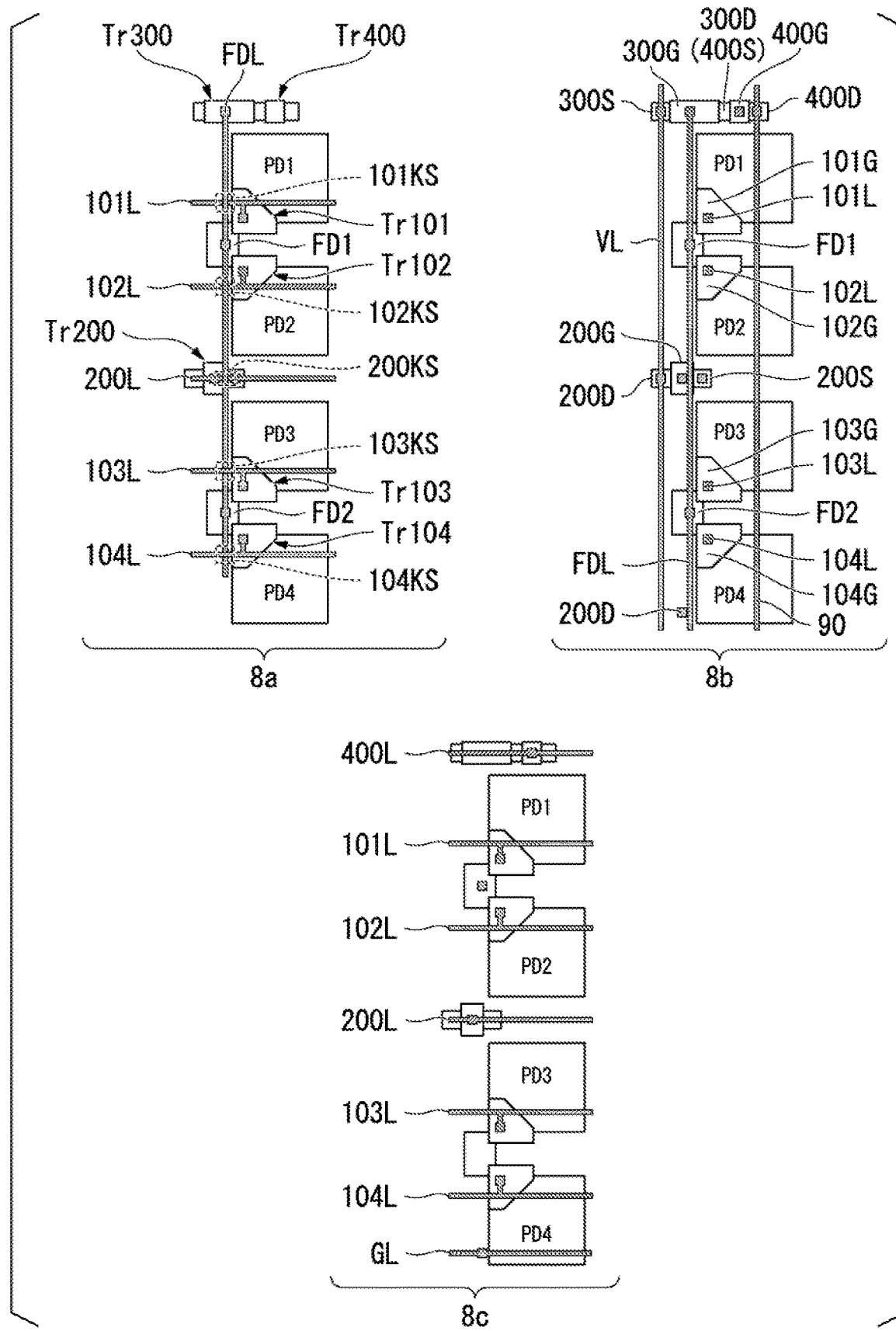
FIG. 8 is a diagram illustrating a pixel layout structure in a pixel sharing unit of a solid-state imaging device according to a modification example 2 of the first embodiment of the present invention.

The following description will be provided for a pixel layout structure in a pixel sharing unit of a solid-state imaging device according to a modification example 2 of the first embodiment of the present invention. In the aforementioned example the photodiode arrangement of 8 (4 longitudinal×2 transverse) pixels is defined as one pixel sharing unit, but the modification example 2 is an example in which a photodiode arrangement of 4 (4 longitudinal×1 transverse) pixels is defined as one pixel sharing unit. FIG. 8 is a diagram illustrating the pixel layout structure in the pixel sharing unit of the solid-state imaging device according to the modification example 2 of the first embodiment of the present invention.

As illustrated in FIG. 8, in the modification example 2, one pixel sharing unit 40 is composed of photodiodes PD1 to PD4 of 4 (4 longitudinal×1 transverse) pixels. (8a) of FIG. 8 is a diagram illustrating main elements of the pixel layout structure in one pixel sharing unit 40 and is a diagram illustrating only a part of the structure for the purpose of description. According to the modification example 2, in the pixel sharing unit 40, a wiring is composed of two wiring layers. (8b) and (8c) of FIG. 8 are exploded diagrams for understanding patterns of a first layer and a second layer of the wiring in the pixel sharing unit 40. (8b) is a diagram when the first layer (the highest layer) of the wiring is viewed from above and (8c) is a diagram when the second layer (the lowest layer) of the wiring is viewed from above.

The pixel sharing unit 40 has a first pixel unit, a second pixel unit, a reset transistor Tr200, an amplification transistor Tr300, and a selection transistor Tr400. In the pixel sharing unit 40, the first pixel unit and the second pixel unit are juxtaposed in a column direction.

The first pixel unit has two (2 longitudinal×1 transverse) photodiodes PD1 and PD2, read gate electrodes 101G and 102G, a floating diffusion FD1, and read transistors Tr101 and Tr102. The second pixel unit has two (2 longitudinal×1 transverse) photodiodes PD3 and PD4, read gate electrodes 103G and 104G, a floating diffusion FD2, and read transistors Tr103 and Tr104.

The photodiodes PD1 to PD4 store signal charge generated by photoelectrically converting incident light. Each of the photodiodes PD1 to PD4 has an approximately quadrangular shape and are disposed in 4 longitudinal×1 transverse at desired intervals, for example, equal intervals in longitudinal and transverse directions.

The read transistors Tr101 to Tr104 are provided correspondingly to the photodiodes PD1 to PD4, respectively. The read transistors Tr101 to Tr104 apply pulses via read wirings 101L to 104L on the basis of the read control signals φTX1 to φTX4 from the vertical reading circuit 10, thereby transferring the signal charge stored in the photodiodes PD1 to PD4 to the floating diffusions FD1 and FD2.

The reset transistor Tr200 has a source electrode 200S, a drain electrode 200D, and a gate electrode 200G. The reset transistor Tr200 is disposed in an area between the photodiodes PD2 and PD3 at the center of the pixel sharing unit 40.

The reset transistor Tr200 applies a pulse via the reset wiring 200L on the basis of the reset control signal φRST from the vertical reading circuit 10, thereby resetting the signal charge stored in the photodiodes PD1 to PD4 and the signal charge stored in the floating diffusions FD1 and FD2 with the power supply voltage VDD via the power wiring VL.

The amplification transistor Tr300 has a source electrode 300S, a drain electrode 300D, and a gate electrode 300G. The amplification transistor Tr300 is disposed in an area between the power wiring VL, and the vertical signal line 90 at the upper part of the pixel sharing unit 40. The amplification transistor Tr300 outputs an amplification signal corresponding to the signal charge stored in the floating diffusions FD1 and FD2 from the source electrode 300S.

The selection transistor Tr400 has a source electrode 400S, a drain electrode 400D, and a gate electrode 400G. The selection transistor Tr400 is disposed in an area between the amplification transistor Tr300 and the vertical signal line 90 at the upper part of the pixel sharing unit 40. The source electrode 400S of the selection transistor Tr400 is connected to the drain electrode 300D of the amplification transistor Tr300. The selection transistor Tr400 applies a pulse via the selection wiring 400L on the basis of the selection control signal φSEL from the vertical reading circuit 10, thereby reading a pixel signal, which is output from the source electrode 300S of the amplification transistor Tr300, to the vertical signal line 90.

The floating diffusion FD1 is disposed at the left side of an area surrounded by the two photodiodes PD1 and PD2. The floating diffusion FD1 converts signal charge transferred from the photodiodes PD1 and PD2 into a voltage, and outputs the voltage to the gate electrode 300G of the amplification transistor Tr300 via the connection wiring FDL.

The floating diffusion FD2 is disposed at the left side of an area surrounded by the two photodiodes PD3 and PD4. The floating diffusion FD2 converts signal charge transferred from the photodiodes PD3 and PD4 into a voltage, and outputs the voltage to the gate electrode 300G of the amplification transistor Tr300 via the connection wiring FDL.

The connection wiring FDL is wired at the left side of the pixel sharing unit 40 in a longitudinal direction in the first layer of the wiring. The connection wiring FDL electrically connects the floating diffusions FD1 and FD2, the gate electrode 300G of the amplification transistor, and the source electrode 200S of the reset transistor to one another. The connection wiring FDL extends to a part below the photodiode PD4, and is disposed to form overlapping areas 101KS to 104KS with the read wirings 101L to 104L. Furthermore, the connection wiring FDL forms an overlapping area 200KS with the reset wiring 200L.

The substrate potential supply wiring GL is wired at the lower part of the pixel sharing unit 40 in a transverse direction in the second layer of the wiring. The substrate potential supply wiring GL supplies a substrate potential (a ground potential) GND to each transistor of the pixel.

Each of the read wirings 101L to 104L is wired in the transverse direction of the pixel sharing unit 40 in the second layer of the wiring. The read wirings 101L to 104L are formed such that they are respectively connected to the read gate electrodes 101G to 104G of the read transistors Tr101 to Tr104, receive an independent read pulse, and are independently controlled.

The reset wiring 200L is configured to be connected to the gate electrode 200G of the reset transistor Tr200 and to receive a reset pulse. The selection wiring 400L is disposed to overlap the selection transistor Tr400 and is connected to the gate electrode 400G of the selection transistor Tr400. The read wirings 101L to 104L, the reset wiring 200L, and the selection wiring 400L are wired in the transverse direction of the pixel sharing unit 40 in the second layer of the wiring, and are disposed such that inter-wiring intervals are large (are approximately equal to one another) as much as possible.

The power wiring VL is wired at the left side of the connection wiring FDL, which is positioned at the left side of the pixel sharing unit 40, in the longitudinal direction in the first layer of the wiring, and is connected to the drain region 200D of the reset transistor Tr200 and the source region 300S of the amplification transistor Tr300. The vertical signal line 90 is wired at the center part of the pixel sharing unit 40 in the longitudinal direction in the first layer of the wiring, and is connected to the drain electrode 400D of the selection transistor Tr400.

Since the operation of the pixel in the case of using the pixel layout structure of the modification example 2 and the operation of the pixel in the case of using the pixel layout structure of the first embodiment are similar to each other, a description thereof will be omitted.

In the modification example 2, similarly to the first embodiment, the connection wiring FDL is partially extended (is extended to a part below the photodiode PD4), that the areas of the overlapping areas 101KS to 104KS become approximately equal to one another. In this way, it is possible to suppress a variation of transfer characteristics at the time of charge transfer of all pixels corresponding to the photodiodes PD1 to PD4, so that noise due to a parasitic capacitor is reduced and thus high image quality is achieved.

Second Embodiment

Figure 9:
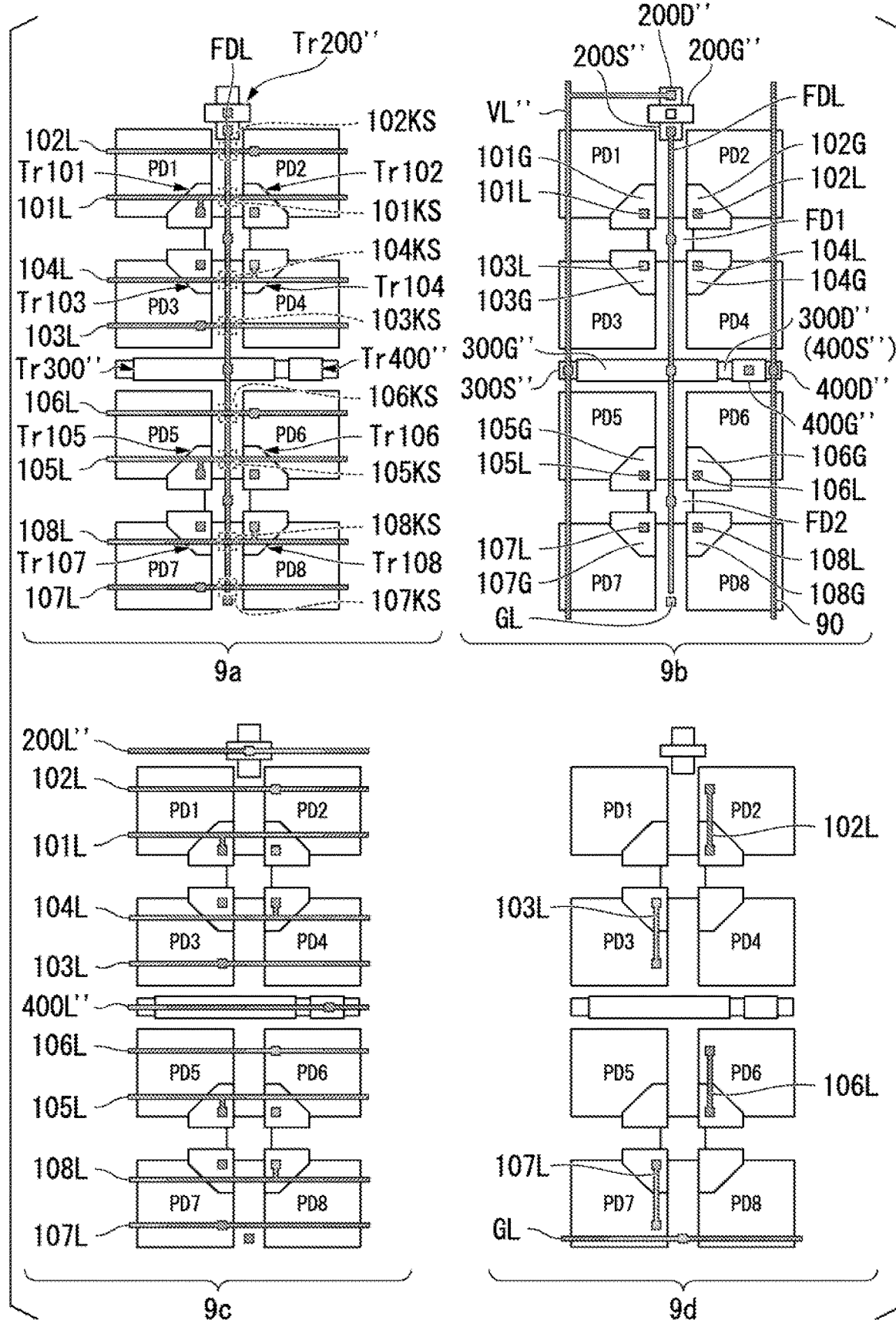
FIG. 9 is a diagram illustrating a pixel layout structure in a pixel sharing unit of a solid-state imaging device according to a second embodiment of the present invention.

The following description will be provided for a pixel layout structure in a pixel sharing unit of a solid-state imaging device according to a second embodiment of the present invention. The second embodiment is an example of a layout structure in which there is no overlapping between a connection wiring and a reset wiring. FIG. 9 is a diagram illustrating the pixel layout structure in the pixel sharing unit of the solid-state imaging device according to the second embodiment of the present invention.

(9a) of FIG. 9 is a diagram illustrating main elements of the pixel layout structure in one pixel sharing unit 40 and is a diagram illustrating only a part of the structure for the purpose of description. In the pixel sharing unit 40, a wiring is composed of three wiring layers. (9b) to (9d) of FIG. 9 are exploded diagrams for understanding patterns of a first layer to a third layer of the wiring in the pixel sharing unit 40. (9b) is a diagram when the first layer (the highest layer) of the wiring is viewed from above, (9c) is a diagram when the second layer of the wiring is viewed from above, and (9d) is a diagram when the third layer (the lowest layer) of the wiring is viewed from above.

The pixel layout structure of the second embodiment of FIG. 9 is different from the pixel layout structure of the first embodiment of FIG. 3 in that the reset transistor Tr200, the a plication transistor Tr300, the selection transistor Tr400, the reset wiring 200L, the selection wiring 400L, and the power wiring VL of FIG. 3 are changed to a reset transistor Tr200", an amplification transistor Tr300", a selection transistor Tr400", reset wiring 200L", a selection wiring 400L", and a power wiring VL" in FIG. 9. Since the other configuration of FIG. 9 is identical to that of FIG. 3, a description thereof will be omitted.

The reset transistor Tr200" of FIG. 9 is different from the reset transistor Tr200 of FIG. 3 in terms of an arrangement position. Specifically, the reset transistor Tr200 of FIG. 3 is disposed in an area between the photodiodes PD3 and PD4 and the photodiodes PD5 and PD5 at the center of the pixel sharing unlit 40, but the reset transistor Tr200" of FIG. 9 is disposed above the photodiodes PD1 and PD2 at the upper part of the pixel sharing unit 40. The reset transistor Tr200" has a source electrode 200S", a drain electrode 200D", and a gate electrode 200G".

The amplification transistor Tr300" of FIG. 9 is different from the amplification transistor Tr300 of FIG. 3 in terms of an arrangement position. Specifically, the amplification transistor Tr300 of FIG. 3 is disposed in an area between the power wiring VL and the vertical signal line 90 above the upper photodiodes PD1 and PD2 at the upper part of the pixel sharing unit 40, but the amplification transistor Tr300" of FIG. 9 is disposed in an area. between the photodiodes PD3 and PD4 and the photodiodes PD5 and PD6 at the center of the pixel sharing unit 40. The amplification transistor Tr300" has a source electrode 300S", a drain electrode 300D", and a gate electrode 300G".

The selection transistor Tr400" of FIG. 9 is different from the selection transistor Tr400 of FIG. 3 in terms of an arrangement position. Specifically, the selection transistor Tr400 of FIG. 3 is disposed in an area between the amplification transistor Tr300 and the vertical signal line 90 above the upper photodiodes PD1 and PD2 at the upper part of the pixel sharing unit 40, but the selection transistor Tr400" of FIG. 9 is disposed in an area between the amplification transistor Tr300" and the vertical signal line 90 between the photodiodes PD3 and PD4 and the photodiodes PD5 and PD6 at the center of the pixel sharing unit 40. The selection transistor Tr400" has a source electrode 400S", a drain electrode 400D", and a gate electrode 400G".

With a change in the arrangement of the aforementioned each transistor, the arrangement of the reset wiring 200L and the selection wiring 400L is changed to the reset wiring 200L" and the selection wiring 400L" of FIG. 9. Specifically the reset wiring 200L" is wired at the upper part of the pixel sharing unit 40 in a transverse direction in the second layer of the wiring. The reset wiring 200L" is connected to the gate electrode 200G" of the reset transistor Tr200". The selection wiring 400L" is wired at the center of the pixel sharing unit 40 in the transverse direction in the second layer of the wiring. The selection wiring 400L" is connected to the gate electrode 400G" of the selection transistor Tr400".

The power wiring VL" is wired at the left side of the pixel sharing unit 40 in a longitudinal direction in the first layer of the wiring and is connected to the drain region 200D" of the reset transistor Tr200" and the source of FIG. 3 300S" of the amplification transistor Tr300".

As described above, each wiring is disposed, so that there is no overlapping area 200KS between the reset wiring 200L and the connection wiring FDL in the pixel layout structure of the second embodiment of FIG. 9.

Figure 10:
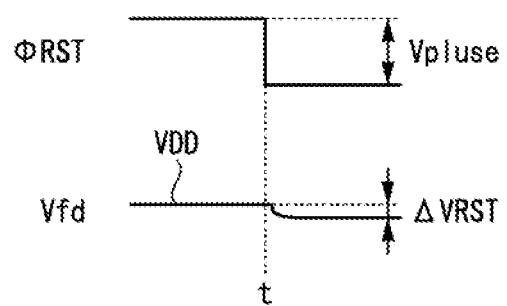
FIG. 10 is a timing chart illustrating a change in a potential of an FD node when a reset transistor is switched from an ON state to an OFF state in the pixel sharing unit of the solid-state imaging device according to the second embodiment of the present invention.

FIG. 10 is a timing chart illustrating a change in a potential of an FD node when the reset transistor Tr200" is switched from an ON state to an OFF state in the pixel sharing unit of the solid-state imaging device according to the second embodiment of the present invention. In FIG. 10, a vertical axis denotes the size of a potential and a horizontal axis denotes time. FIG. 10 illustrates the movement of the potential of the reset control signal ϕRST and the movement of the potential Vfd of the FD node when the reset transistor Tr200" is switched from an ON state to an OFF state.

In a state in which the gate electrode 200G" is in an ON state, the potential Vfd of the FD node is fixed to the power supply voltage VDD. At a time t, since the potential of the reset control signal ϕRST is dropped by Vpluse, the reset transistor Tr200" is switched from an ON state to an OFF state, that is, the gate electrode 200G" is switched from the ON state to the OFF state, so that reset is released. In this case, the potential Vfd of the FD node is dropped by ΔVRST from VDD due to an influence of feedthrough.

When the capacitance value of the floating diffusion is set as CFD and the capacitance value of the overlapping area 200KS between the reset wiring 200L and the connection wiring FDL is set as C200KS, ΔVRST is expressed by the following Equation (3).

$$\Delta VRST = C200KS \times Vpluse(C200KS + CFD) \qquad (3)$$

As the potential Vfd of the FD node is large, since the signal charge stored in the photodiodes PD1 to PD5 is easily transferred to the floating diffusions FD1 and FD2, it is preferable that the value of ΔVRST is small. Accordingly, it is preferable that the size (the area) of the overlapping area 200KS is small.

In the present embodiment, the reset transistor Tr200" is disposed at the end portion of the connection wiring FDL, so that there is no overlapping area 200KS between the reset wiring 200L and the connection wiring FDL. In this way, it is possible to reduce a voltage drop of the FD node due to an influence of feedthrough when the reset transistor Tr200" is switched to the OFF state. In this way, in the present embodiment, transfer characteristics at the time of charge transfer of all pixels corresponding to the photodiodes PD1 to PD8 are improved, so that high image quality is achieved, in addition to the effects of the first embodiment.

Third Embodiment

Figure 11:
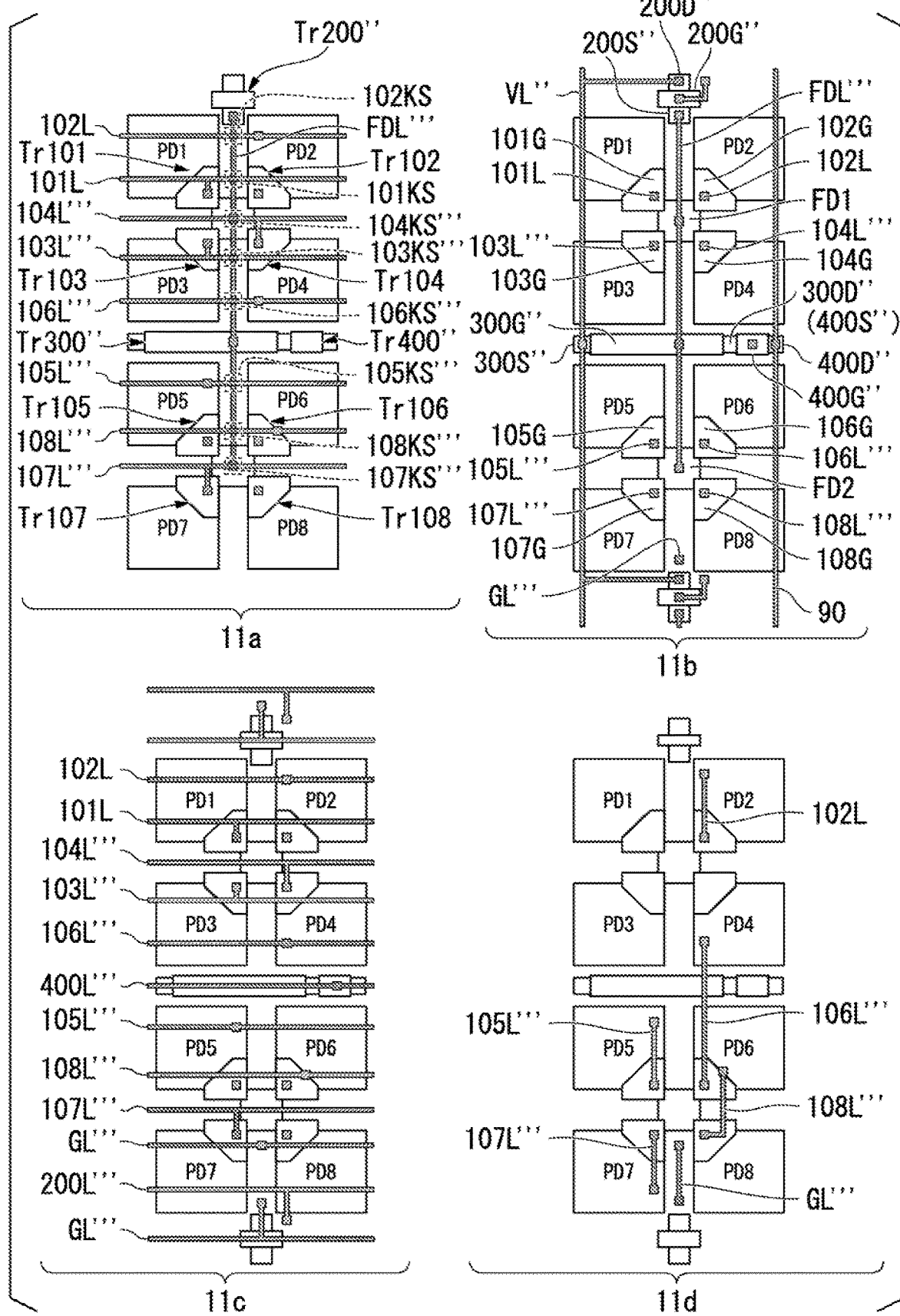
FIG. 11 is a diagram illustrating a pixel layout structure in a pixel sharing unit of a solid-state imaging device according to a third embodiment of the present invention.
Figure 12:
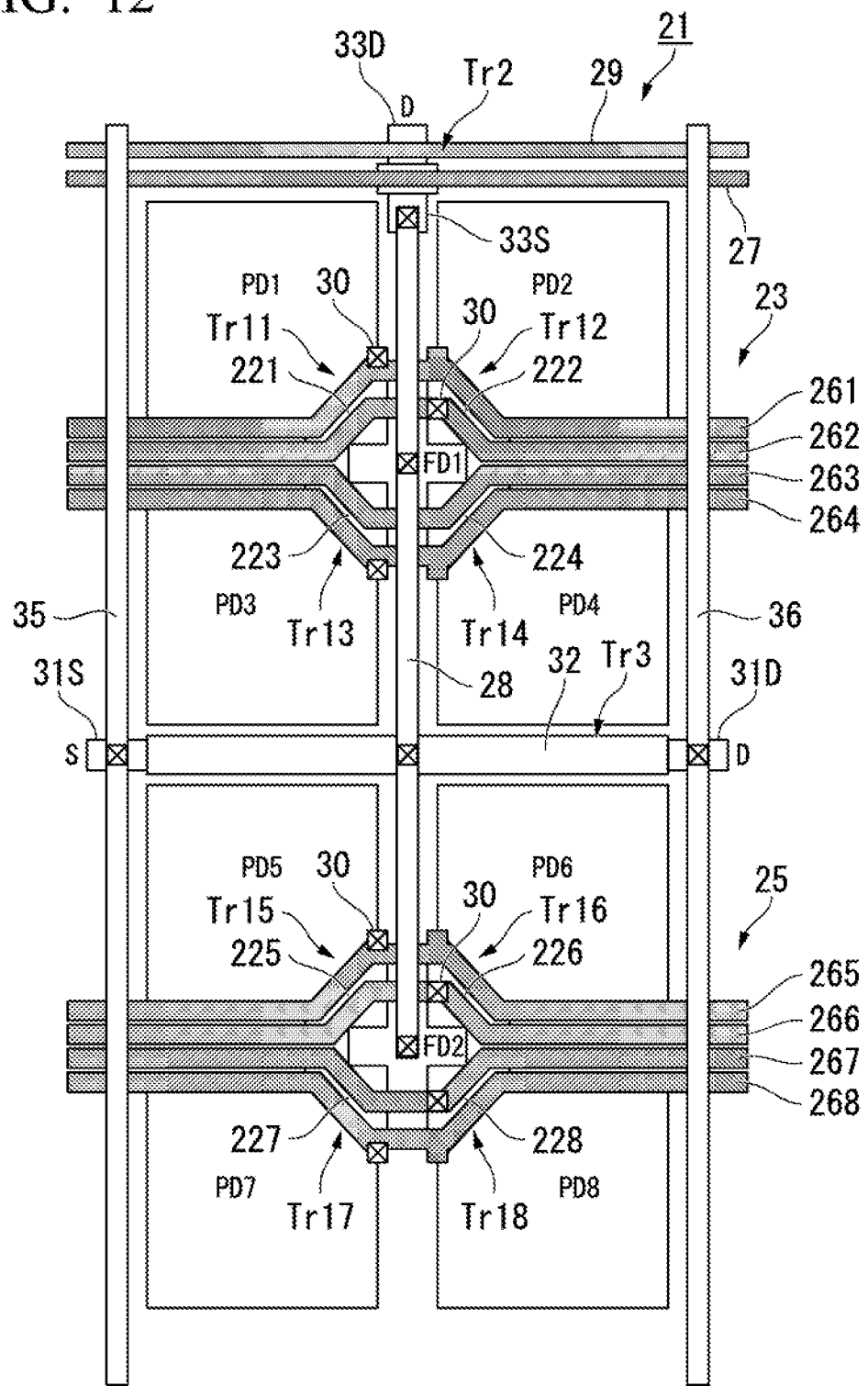
FIG. 12 is a diagram illustrating a layout of a pixel sharing unit in a pixel array unit of a solid-state imaging device according to the related art.

The following description will be provided for a pixel layout structure in a pixel sharing unit of a solid-state imaging device according to a third embodiment of the present invention. The third embodiment is an example of a pixel layout structure in which a connection wiring for connecting a floating diffusion to a reset transistor is disposed on a straight line. FIG. 11 is a diagram illustrating the pixel layout structure in the pixel sharing unit of the solid-state imaging device according to the third embodiment of the present invention.

(11a) of FIG. 11 is a diagram illustrating main elements of the pixel layout structure in one pixel sharing unit 40 and is a diagram illustrating only a part of the structure for the purpose of description. In the pixel sharing runt 40 a wiring is composed of three wiring layers. (11b) to (11d) of FIG. 11 are exploded diagrams for understanding patterns of a first layer to a third layer of the wiring in the pixel sharing unit 40. (11b) is a diagram when the first layer (the highest layer) of the wiring is viewed from above, (11c) is a diagram when the second layer of the wiring is viewed from above, and (11d) is a diagram when the third layer (the lowest layer) of the wiring is viewed from above.

The pixel layout structure of the third embodiment of FIG. 11 is different from the pixel layout structure of the second embodiment of FIG. 9 in that the connection wiring FDL, the read wirings 103L to 108L, the reset wiring 200L", the substrate potential supply wiring GL, and the overlapping areas 103KS to 108KS between the connection wiring FDL and the read wirings 103L to 108L of FIG. 9 are changed to a connection wiring FDL''', read wirings 103L''' to 108L''', a reset wiring 200L''', a substrate potential supply wiring GL''', and overlapping areas 103KS''' to 108KS''' in FIG. 11. Since the other configuration of FIG. 11 is identical to that of FIG. 9, a description thereof will be omitted.

The connection wiring FDL''' is wired at the center of the pixel sharing unit 40 in a longitudinal direction in the first layer of the wiring. The connection wiring FDL''' electrically connects the floating diffusions FD1 and FD2, the gate electrode 300G''' of the amplification transistor, and the source electrode 200S" of the reset transistor to one another. In the present embodiment, the connection wiring FDL''' does not extend in the direction of the photodiodes PD7 and PD8, and its lower end is connected as a connection part which is in the center of the floating diffusion FD2.

The read wirings 101L, 102L, 103L''' to 108L''' are wired in the transverse direction of the pixel sharing unit 40 in the second layer of the wiring. The read wirings 101L, 102L, 103L''' to 108L''' are formed such that they are respectively connected to the read gate electrodes 101E to 108G of the read transistors Tr101 to Tr108 receive an independent read pulse, and are independently controlled.

In the present embodiment, the entire read wirings 103L''' to 108L''' are shifted little by little in the direction of the photodiodes PD1 and PD2 in order to ensure overlapping areas with the connection wiring FDL'''. In this way, all overlapping areas 101KS, 102KS, 103KS''' to 108KS''' between the read wirings 101L, 102L, 103L''' to 108L''' and the connection wiring FDL''' exist on the connection wiring FDL'''.

The reset wiring 200L''' is wired in the transverse direction of the pixel sharing unit 40 in the second layer of the wiring. The reset wiring 200L''' is configured to be connected to the gate electrode 200G" of the reset transistor Tr200" and to receive a reset pulse. In the present embodiment, the reset wiring 200L''' is disposed to be separated from the connection wiring FDL''' as much as possible. For example, as illustrated in FIG. 11, the reset wiring 200L''' is disposed to overlap the lower parts of the photodiodes PD7 and PD8.

The substrate potential supply wiring GL''' supplies a substrate potential (a ground potential) GND to each transistor of the pixel. In the present embodiment, the substrate potential supply wiring GL''' is wired at the lower part of the pixel sharing unit 40 in the transverse direction in the second layer of the wiring, and is disposed between the connection wiring FDL''' and the reset wiring 200L''' and below the reset wiring 200L'''.

The selection wiring 400L''' is wired in the transverse direction of the pixel sharing unit 40 in the second layer of the wiring. The selection wiring 400L''' is disposed to overlap the selection transistor Tr400" and is connected to the gate electrode 400G" of the selection transistor Tr400".

As illustrated in FIG. 11, in the present embodiment, the read wirings 102L, 101L, 104L''', 103L''', and 106L''', the selection wiring 400L''', the read wirings 105L''', 108L''', and 107''', the substrate potential supply wiring GL''', the reset wiring 200L''', and the substrate potential supply wiring GL''' are wired in this order in the transverse direction of the pixel sharing unit 40 in the second layer of the wiring and are disposed such that inter-wiring intervals are made large (are approximately equal to one another) as much as possible.

In the present embodiment, the following four effects are obtained in addition to the effects of the first embodiment and the second embodiment.

According to the first effect, the connection wiring FDL''' is made short, so that the capacitance values of the floating diffusions FD1 and FD2 are reduced. In this way, a conversion gain to a voltage from signal charge is increased and an influence of noise occurring in a subsequent stage is reduced. That is, an increase in the capacitance of the floating diffusion is suppressed, so that it is possible to ensure a high conversion gain.

According to the second effect, the connection wiring FDL''' is made short, so that the capacitance values of the floating diffusions FD1 and FD2 are reduced. In this way, an influence of feedthrough when each read gate electrode is switched to an ON state is made large. This is apparent from Equation (1) above in which when the capacitance value CFD of the floating diffusion is decreased, the potential increase value ΔV1 of the FD node is increased. In this way, transfer characteristics at the time of charge transfer of all pixels corresponding to the photodiodes PD1 to PD8 are improved.

According to the third effect, the reset wiring 700L''' is interposed between two substrate potential supply wirings GL''', so that it is possible to further reduce a parasitic capacitor between the reset wiring 200L''' and the connection wiring FDL'''. In this way, it is possible to further suppress a voltage drop of the connection wiring FDL''' when the reset gate 200G" is switched to an OFF state, so that transfer characteristics at the time of charge transfer of all pixels corresponding to the photodiodes PD1 to PD8 are improved.

According to the fourth effect, a positional relation between the photodiodes PD1 to PD8 and each wiring (the second layer of the wiring of FIG. 11) becomes uniform. In this way, an influence to the photodiodes PD1 to PD8 due to reflection from each wiring becomes uniform, so that it is possible to reduce a variation of pixel characteristics in the pixel sharing unit 40.

In the above examples, a photodiode arrangement of 8 (4 longitudinal×2 transverse) pixels or 4 (4 longitudinal×1 transverse) pixels is defined as one pixel sharing unit. However, in addition, a photodiode arrangement of transversal 2×longitudinal 4n pixels (n is a positive integer), such as a photodiode arrangement of the total 12 (2 transverse×6 longitudinal) pixels and a photodiode arrangement of the total 16 (2 transverse×8 longitudinal) pixels, can be configured as one pixel sharing unit.

In the present specification, the words indicating directions, such as "front, rear, up, down, right, left, vertical, horizontal, longitudinal, transversal, row, and column" are used in order to describe these directions in the device of the present invention. Accordingly, these words used in order to describe the specification of the present invention should be relatively construed in the device of the present invention.

The words used in the present specification in order to indicate the degree of "generally", "about", "approximately" and the like represent that there is a reasonable variation in a range in which a final result is not significantly changed. Accordingly, the word indicating "approximately equal" also includes "completely equal".

While preferred embodiments of the present invention have been described, the present invention is not limited to these embodiments and the modification examples thereof. Additions, omissions, substitutions, and other modifications of elements can be made without departing from the spirit of the present invention. Accordingly, the invention is not to be considered as being limited by the foregoing description, and is only limited by the scope of the appended claims.

According to the solid-stage imaging device of the aforementioned each aspect, it is possible to implement a solid-state imaging device capable of suppressing degradation of image quality even through there is a parasitic capacitor between a connection wiring and other wirings.

What is claimed is:

1. A solid-state imaging device comprising:
   a pixel sharing unit,
   wherein the pixel sharing unit comprises:
   a plurality of pixel units each including
      a plurality of photodiodes that store charge corresponding to an amount of incident light,
      one or more floating diffusions shared by the plurality of photodiodes, and
      a plurality of read transistors each provided to each of the plurality of photodiodes and reading the charge stored in each of the plurality of photodiodes to output to the one or more floating diffusions;
   a reset transistor and an amplification transistor shared by the plurality of pixel units;
   a plurality of read wirings respectively connected to a read gate electrode of each of the plurality of read transistors; and
   a connection wiring that connects the one or more floating diffusions included in each of the plurality of pixel units to each other,
   wherein, in the pixel sharing unit, the connection wiring and each of the plurality of read wirings are disposed to have overlapping areas in a plan view, and the connection wiring and the plurality of read wirings are disposed such that parasitic capacitors generated in the plurality of overlapping areas are approximately equal to one another.

2. The solid-state imaging device according to claim 1, wherein the connection wiring and the plurality of read wirings are disposed such that areas of the plurality of overlapping areas are approximately equal to one another in a plain view.

3. The solid-state imaging device according to claim 1, wherein the floating diffusions included in the pixel sharing unit and the reset transistor are disposed on a straight line and are connected to each other by the connection wiring, and
   the plurality of overlapping areas are all disposed between the reset transistor and a floating diffusion disposed at a position remotest from the reset transistor.

4. The solid-state imaging device according to claim 1, wherein a reset wiring connected to a reset gate electrode of the reset transistor and the connection wiring are disposed such that there is no overlapping area in the plan view.

5. The solid-state imaging device according to claim 1, wherein the pixel sharing unit includes two pixel units each including the plurality of photodiodes disposed in 2 rows×2 columns and one floating diffusion disposed at a center of the plurality of photodiodes disposed in 2 rows×2 columns, the pixel units being juxtaposed in a column direction.

* * * * *